United States Patent
Xu et al.

(10) Patent No.: US 12,021,030 B2
(45) Date of Patent: Jun. 25, 2024

(54) CONTACT STRUCTURE AND METHOD OF FORMING THE SAME

(71) Applicant: Yangtze Memory Technologies Co., Ltd., Hubei (CN)

(72) Inventors: Wei Xu, Wuhan (CN); Qingqing Wang, Wuhan (CN); Jinxing Chen, Wuhan (CN); Guanglong Fan, Wuhan (CN); Huichao Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 574 days.

(21) Appl. No.: 17/219,949

(22) Filed: Apr. 1, 2021

(65) Prior Publication Data
US 2022/0285275 A1 Sep. 8, 2022

Related U.S. Application Data

(63) Continuation of application No. PCT/CN2021/079084, filed on Mar. 4, 2021.

(51) Int. Cl.
| | |
|---|---|
| *H01L 23/535* | (2006.01) |
| *H01L 21/3105* | (2006.01) |
| *H01L 21/768* | (2006.01) |
| *H01L 27/00* | (2006.01) |
| *H10B 43/27* | (2023.01) |

(52) U.S. Cl.
CPC ...... *H01L 23/535* (2013.01); *H01L 21/31053* (2013.01); *H01L 21/76805* (2013.01); *H01L 21/76819* (2013.01); *H01L 21/76895* (2013.01); *H10B 43/27* (2023.02)

(58) Field of Classification Search
CPC ......... H01L 21/31053; H01L 21/76805; H01L 21/76819; H01L 21/76895; H01L 21/76816; H01L 21/768; H01L 21/76879; H01L 23/535; H01L 23/528; H01L 23/49822; H01L 23/53223; H01L 21/3105; H01L 21/31051; H01L 23/481;
(Continued)

(56) References Cited

U.S. PATENT DOCUMENTS

| | | |
|---|---|---|
| 10,522,561 B2 | 12/2019 | Zhang et al. |
| 2007/0202679 A1 | 8/2007 | Ahn et al. |

(Continued)

FOREIGN PATENT DOCUMENTS

| | | |
|---|---|---|
| CN | 111244106 A | 6/2020 |
| CN | 111279479 A | 6/2020 |
| CN | 111627916 A | 9/2020 |

OTHER PUBLICATIONS

International Search Report dated Nov. 30, 2021 in PCT/CN2021/079084, 4 pages.

*Primary Examiner* — Nikolay K Yushin
(74) *Attorney, Agent, or Firm* — Oblon, McClelland, Maier & Neustadt, L.L.P.

(57) ABSTRACT

Aspects of the disclosure provide a semiconductor device. The semiconductor device can include a trench formed in a first dielectric layer, a trench filler layer that fills a portion of the trench, a conductive layer over the trench filler layer, and a second dielectric layer over the conductive layer. The second dielectric layer is disposed in the trench. The semiconductor device can also include a contact structure configured to connect to the conductive layer through a hole in the second dielectric layer.

23 Claims, 5 Drawing Sheets

(58) Field of Classification Search
CPC ........ H10B 43/27; H10B 43/35; H10B 43/50;
H10B 43/30; H10B 43/40
See application file for complete search history.

(56) References Cited

U.S. PATENT DOCUMENTS

| | | |
|---|---|---|
| 2016/0056302 A1* | 2/2016 | Bin .................... H01L 29/7926 257/324 |
| 2019/0067324 A1 | 2/2019 | Zhang et al. |
| 2019/0326314 A1 | 10/2019 | Xiao et al. |
| 2021/0225863 A1 | 7/2021 | Wu et al. |
| 2021/0272982 A1 | 9/2021 | Wu et al. |

* cited by examiner

CONTACT STRUCTURE AND METHOD OF FORMING THE SAME

RELATED APPLICATION

This application is a bypass continuation of International Application No. PCT/CN2021/079084, filed on Mar. 4, 2021. The entire disclosure of the prior application is hereby incorporated by reference in its entirety.

TECHNICAL FIELD

The present application describes embodiments generally related to semiconductor devices and semiconductor device fabrication.

BACKGROUND

Chemical mechanical polishing or planarization (CMP) is a fabrication technique that removes materials by a combination of chemical and mechanical actions to achieve highly smooth and planar material surfaces. CMP can be viewed as a hybrid of chemical etching and free abrasive polishing. CMP has been widely used in semiconductor device manufacturing for surface planarization.

SUMMARY

Aspects of the disclosure provide a semiconductor device with a contact structure and a method of forming the semiconductor device with the contact structure.

According to a first aspect, a semiconductor device is provided. The semiconductor device includes a trench formed in a first dielectric layer, a trench filler layer that fills a portion of the trench, a first conductive layer over the trench filler layer, a second dielectric layer over the first conductive layer, where the second dielectric layer is disposed in the trench, and a contact structure configured to connect to the first conductive layer through a hole in the second dielectric layer.

In some embodiments, the first conductive layer includes a first portion between the second dielectric layer and the trench filler layer and a second portion disposed along a sidewall of the trench. The second portion is between the sidewall of the trench and the second dielectric layer.

In some embodiments, the first conductive layer includes at least one of a tungsten layer or a titanium nitride layer.

In some embodiments, the first dielectric layer and the second dielectric layer include a same material.

In some embodiments, the semiconductor device further includes a substrate and a stack of alternating insulating layers and gate layers between the first dielectric layer and the substrate, where the trench extends through the stack and divides the stack into blocks. In some embodiments, the semiconductor device further includes a second conductive layer along a sidewall of the trench. The second conductive layer is disposed between the stack and the trench. In some embodiments, the semiconductor device further includes a third dielectric layer laterally between the trench and the stack. The third dielectric layer and the first dielectric layer include a same material. In some embodiments, the second conductive layer includes titanium nitride.

In some embodiments, the semiconductor device further includes a substrate, a stack of alternating insulating layers and gate layers between the first dielectric layer and the substrate, and a plurality of channel structures each extending vertically through the stack into the substrate. In some embodiments, the plurality of channel structures each includes a channel hole that extends through the stack, a functional layer, a semiconductor layer, and a third dielectric layer being disposed in the channel hole. The trench filler layer is disposed over the third dielectric layer. In some embodiments, the trench filler layer includes doped polysilicon.

According to a second aspect, a semiconductor device is provided. The semiconductor device includes a stack of alternating insulating layers and gate layers, a first dielectric layer over the stack, a trench extending vertically through the first dielectric layer and the stack, a trench filler layer that fills a portion of the trench, a first conductive layer including a first portion disposed over the trench filler layer and a second portion disposed along a sidewall of the trench, and a second dielectric layer disposed in the trench. The second dielectric layer is coplanar with the second portion of the first conductive layer.

In some embodiments, the semiconductor device further includes a contact structure that is configured to connect to the first conductive layer through a hole in the second dielectric layer. In some embodiments, the semiconductor device further includes a cap insulating layer disposed over the first dielectric layer. The contact structure is connected to the first conductive layer through a hole extending in the cap insulating layer and the second dielectric layer.

In some embodiments, the first conductive layer includes at least one of tungsten or titanium nitride, and the second dielectric layer includes silicon oxide.

In some embodiments, the semiconductor device further includes a third dielectric layer laterally between the trench and the stack. The third dielectric layer and the first dielectric layer include a same material.

In some embodiments, the semiconductor device further includes a second conductive layer that includes a first portion between the stack and the trench and a second portion between the trench filler layer and the substrate.

In some embodiments, the first conductive layer is positioned above the gate layers.

According to a third aspect, a method of fabricating a semiconductor device is provided. The method includes forming a trench in a first dielectric layer, filling a portion of the trench with a trench filler layer, forming a conductive layer over the trench filler layer, and forming a second dielectric layer over the first conductive layer. The second dielectric layer is disposed in the trench. A contact structure is formed that is configured to connect to the conductive layer through a hole in the second dielectric layer.

In some embodiments, the forming the conductive layer over the trench filler layer and the second dielectric layer over the trench filler layer includes depositing one or more conductive materials over the trench filler layer and the first dielectric layer, depositing the second dielectric layer in the trench and over the one or more conductive materials, and executing a chemical mechanical polishing (CMP) process that removes the second dielectric layer and the one or more conductive materials on the first dielectric layer.

In some embodiments, the forming the trench in the first dielectric layer further includes forming a stack of alternating insulating layers and sacrificial gate layers over a substrate, forming channel structures in a core region of the stack, depositing the first dielectric layer over the stack, and forming the trench in the first dielectric layer and the stack. In some embodiments, the forming the conductive layer over the trench filler layer includes filling the trench with the trench filler layer, etching back the trench filler layer to form a recess, and forming the conductive layer in the recess.

In some embodiments, a cap insulating layer is deposited over the first dielectric layer, the conductive layer, and the second dielectric layer. The hole further extends through the cap insulating layer. The contact structure is formed that is configured to connect to the conductive layer through the hole.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 3C' shows an enlarged view of a portion (shown by 3C' in FIG. 3C) of the semiconductor device 100, in accordance with exemplary embodiments of the disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some aspects of the disclosure, a CMP process can introduce undesirable side effects, including stress cracking and material dishing. Stress cracking can lead to crack or void formation and may induce short circuits or leakage in semiconductor devices. In some examples, dishing can be caused by a soft material or an open area. In an example of a polishing step to polish a surface with a relatively large open area in the staircase region, dishing may occur in the staircase region. The surface of the staircase region may exhibit a cylindrical shape (like a dish) after polishing. Dishing can result in surface non-planarity and thickness variation. Dishing can also cause significant yield loss in the back end of line (BEOL).

Particularly, in some related examples, a CMP process is utilized in an array common source technology to form metal plugs for connecting to array common source (ACS) structures in 3D NAND flash memory devices. In some examples, the ACS structures are formed within gate line cut trenches in a first dielectric layer. To form the metal plugs, a portion of the ACS structures are removed in respective gate line cut trenches to form a recess in the gate line cut trenches for the metal plugs. A metal material, such as tungsten, is then deposited to fill the recess and can often overfill the trench. In some examples, due to previous CMP processes (e.g., planarization after staircase formation), dishing may occur in the staircase region, for example, due to a relatively large open area of the staircase region, and the metal material may fill the dishing area in the staircase region that can cause short circuits if not removed. In order to remove the metal material in the dishing in the staircase region, a two-step CMP process can be used. For example, a first step of the two-step CMP process is suitably configured for removing excess metal material. The first step can remove the metal material that is overfilled in the array region and can expose the first dielectric layer in the array region. Due to the dishing in the staircase region, the first step may not be able to completely or sufficiently remove the metal material in the dishing of the staircase region. Subsequently, a second step of the two-step CMP process is suitably configured to polish both the first dielectric layer in the array region and the metal material in the gate line cut trenches, and to polish the metal material in the dishing of the staircase region. The two steps of the two-step CMP process can have different polishing characteristics, such as different percentages of chemical components, different mechanical parameters, and the like which can increase processing time, complexity, and cost. Further, in an example, because the metal material and the first dielectric layer typically have relatively large difference in hardness, crack formation may occur, for example at an interface of the conductive material and the first dielectric layer during the second step of the two-step CMP process.

The present disclosure provides techniques to reduce the chance of cracking during formation of a contact structure. Further, the formation of the contact structure can use a single-step CMP process instead of the two-step CMP process. Specifically, in some embodiments, instead of forming a metal plug in the aforementioned related examples, a first conductive layer is formed and a second dielectric layer is disposed over the first conductive layer. A contact structure is then formed that is configured to connect to the first conductive layer through a hole in the second dielectric layer. In some examples, the first conductive layer includes a metal material and can be thinner than the second dielectric layer. Due to the thinner metal layer, a majority of the materials for polishing can be the second dielectric material, so a single-step CMP process can be used. Therefore, techniques herein can eliminate the need for two separate CMP processes and reduce processing time and cost.

According to some aspects of the disclosure, techniques herein can avoid crack formation during the CMP process. Using the techniques herein, in some examples, a majority of materials to be polished can be the second dielectric material that has a hardness that is closer to a hardness of the first dielectric layer than the metal layer. For example, the second dielectric layer can have about the same hardness as the first dielectric layer. Thus, in some examples, less stress is generated during the CMP process and the chance of cracking can be reduced.

Figure 1A:
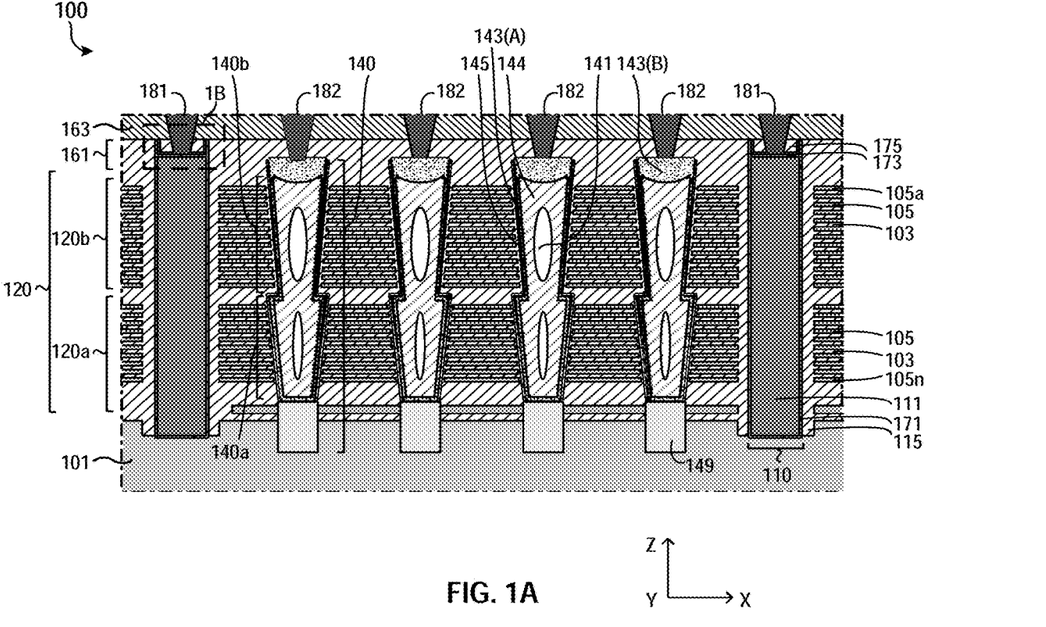
FIG. 1A is a cross-sectional view of a semiconductor device, in accordance with exemplary embodiments of the disclosure.
Figure 1B:
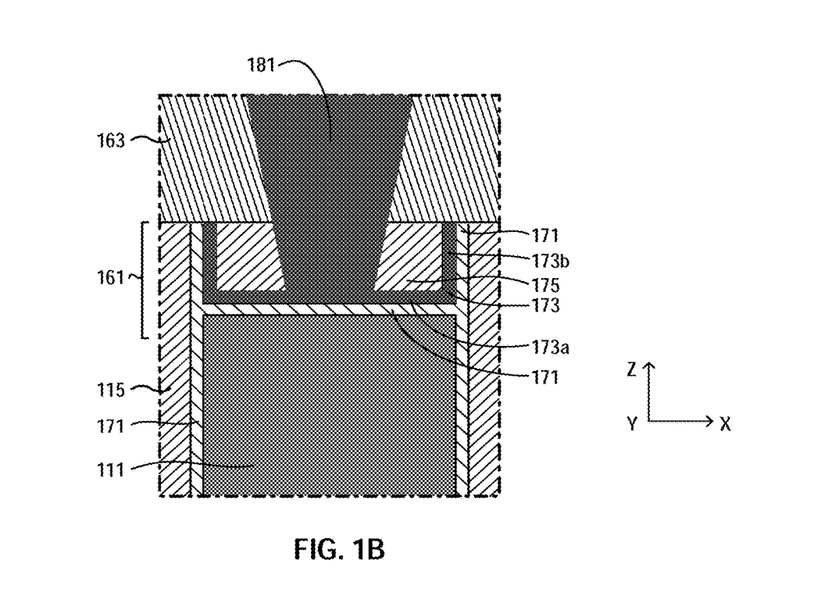
FIG. 1B shows an enlarged view of a portion (shown by 1B in FIG. 1A) of the semiconductor device 100, in accordance with exemplary embodiments of the disclosure.

FIG. 1A shows a cross-sectional view of a semiconductor device 100 and FIG. 1B shows an enlarged view of a portion (shown by 1B in FIG. 1A) of the semiconductor device 100, in accordance with exemplary embodiments of the disclosure. As shown, the semiconductor device 100 includes a first dielectric layer 161 that will be planarized in a subsequent step. In some examples, due to the planarization after the staircase formation, the first dielectric layer 161 may have dishing in a staircase region (not shown). The semiconductor device 100 can also include one or more trenches 110 (also referred to as gate line cut trenches) formed in the first dielectric layer 161. Further, the semiconductor device 100 includes a trench filler layer 111 that fills a portion of the trench 110, a first conductive layer 173 over the trench filler layer 111, and a second dielectric layer 175 over the first conductive layer 173, where the second dielectric layer 175 is disposed in the trench 110. The first conductive layer 173 and the second dielectric layer 175 can be planarized using a single step CMP process and can be formed with less or no cracking compared to the related examples.

Specifically, in the FIG. 1A example, the semiconductor device 100 can include a substrate 101 and structures formed on the substrate 101. For example, one or more stacks 120 (e.g., 120a-120b) of alternating insulating layers 103 and gate layers 105 can be disposed on the substrate 101. Further, channel structures 140 are formed in the one or more stacks 120, and the channel structures 140 can extend through the stacks 120.

Further, in the FIG. 1A example, the trenches 110 also extend through the stacks 120. As a result, the trench filler layer 111 can extend through the stacks 120 and divide the stacks 120 into blocks. In this example, the trench filler layer 111 is conductively connected to source terminals of the channel structures 140 and can therefore function as an ACS structure. The semiconductor device 100 can also include a second conductive layer 171 (e.g., titanium nitride) along a sidewall of the trench 110, and the second conductive layer 171 is disposed between the stacks 120 and the trench 110. Further, a third dielectric layer 115 can be laterally disposed between the trench 110 and the stacks 120. In some embodiments, the third dielectric layer 115, the first dielectric layer 161, and the insulating layers 103 are made of a same material, such as silicon oxide. In other embodiments, the third dielectric layer 115, the first dielectric layer 161, and the insulating layers 103 can be made of different dielectric materials. Additionally, the second conductive layer 171 can also be disposed between the substrate 101 and the trench filler layer 111.

The semiconductor device 100 can further include the first conductive layer 173 and the second dielectric layer 175 that are disposed in the trenches 110. In some examples, the first conductive layer 173 can have a U shape in a vertical cross section in the XZ plane as shown in FIG. 1B. Accordingly, the first conductive layer 173 can have a horizontal portion 173a (also referred to as a first portion) between the second dielectric layer 175 and the trench filler layer 111 and a vertical portion 173b (also referred to as a second portion) disposed along a sidewall of the trench 110. The second portion 173b is arranged between the sidewall of the trench 110 and the second dielectric layer 175. Note that the first conductive layer 173 can be conformally or semi-conformally deposited so that a thickness of the horizontal portion 173a in the Z direction is equal to or similar to a width of the vertical portion 173b in the X direction. In some other examples where the first conductive layer 173 is selectively deposited on the trench filler layer 111, the first conductive layer 173 may have the horizontal portion 173a only.

Further, the first conductive layer 173 includes a conductive material, such as tungsten, titanium nitride, and the like. In some examples, the second dielectric layer 175 and the first dielectric layer 161 are chosen to have similar or identical hardness. In an example, the second dielectric layer 175 and the first dielectric layer 161 are made of a same material, such as silicon oxide. In various embodiments, the first conductive layer 173 is thinner than the second dielectric layer 175. For example, the second dielectric layer 175 can have a thickness ranging from 25 nm to 95 nm in the Z direction and a width of about 200 nm in the X direction. In one example, the first conductive layer 173 includes tungsten (about 10 nm-20 nm thick), and the second conductive layer 171 includes titanium nitride (about 15 nm-30 nm thick). In another example, the semiconductor device 100 only includes one conductive layer that is made of titanium nitride (about 15 nm-30 nm thick).

Still referring to FIGS. 1A and 1B, a cap insulating layer 163 (e.g., silicon oxide) can be disposed over the first dielectric layer 161. Contact structures 181 can be formed to connect to the first conductive layers 173 through holes in the second dielectric layers 175 and the cap insulating layer 163. As a result, the contact structures 181 are configured to be connected to the respective trench filler layer 111 via the respective first conductive layers 173 and can thus function as ACS contacts. In some examples, the contact structures 181 and the first conductive layers 173 are made of a same conductive material, such as tungsten. In some other examples, the contact structures 181 and the first conductive layers 173 are made of different metal materials.

As has been mentioned before, the trench filler layer 111 is configured to be connected to the source terminals of the channel structures 140 of the stacks 120. In various embodiments, the stacks 120 of alternating insulating layers 103 and gate layers 105 along with the channel structures 140 can be configured to form a stack of transistors, such as an array of vertical memory cell strings. In some examples, the stack of transistors can include memory cells and select transistors, such as one or more bottom select transistors, one or more top select transistors, and the like. In some examples, the stack of transistors can also include one or more dummy select transistors. Accordingly, the gate layers 105 can include a top select gate (TSG) 105a and a bottom select gate (BSG) 105n. In some embodiments, the first conductive layer 173 is positioned away from the TSG 105a to prevent electrical interference between the first conductive layer 173 and the TSG 105a. In some embodiments, the gate layers 105 can further include one or more dummy TSGs below the TSG 105a and one or more dummy BSGs above the BSG 105n.

It should be noted that the number of gate layers 105 and the number of stacks (e.g., 120a and 120b) depend on specific design requirements. The stack 120a and the stack 120b can include the same or different numbers of gate layers 105. In an embodiment, the stack 120a includes more than sixty gate layers 105, and the stack 120b includes more than one hundred gate layers 105. In another embodiment, the stack 120a and the stack 120b both include more than one hundred 105. In alternative embodiments, the semiconductor device 100 may include only one stack or more than two stacks. Additionally, the insulating layers 103 can typically be made of silicon oxide. In some embodiments, the gate layers 105 may include one or more metal layers sandwiched between glue layers arranged between high dielectric constant (high-k) layers. The metal layers can include tungsten, cobalt, or the like. The high-k layers can include aluminum oxide, hafnium oxide, tantalum oxide, and the like.

As shown in FIG. 1A, the channel structures 140 can include a channel layer 143(A) surrounded by one or more insulating layers 145. For example, the channel layer 143(A) (e.g., polysilicon) can be surrounded by a tunneling layer (e.g., silicon oxide), the tunneling layer can be surrounded by a charge trapping layer (e.g., silicon nitride), and the charge trapping layer can be surrounded by a barrier layer (e.g., silicon oxide). The channel structures 140 can also include an insulating layer 144 and voids 141 formed inside the insulating layer 144. Alternatively, the voids 141 can be filled with an insulating material (e.g., silicon oxide). In the FIG. 1A example, the semiconductor device 100 includes two stacks 120a and 120b. Accordingly, the channel structures 140 include first portions 140a and second portions 140b. Each of the first portions 140a is aligned with and connected to a respective second portion 140b. While the first portions 140a and the second portions 140b are illustrated as having trapezoid shapes in the XZ plane, the first portions 140a and the second portions 140b can have any suitable shapes, such as a pillar shape in the XZ plane and a rectangular or circular shape in the XY plane.

Further, the channel structures 140 can be configured to connect to the substrate 101 via bottom portions 149 that are disposed below the channel structures 140. In some embodiments, the channel layers 143(A) are connected to the bottom portions 149. Additionally, the channel structures 140 can be configured to connect to channel contact structures 182. The channel contact structures 182 extend through the cap insulating layer 163 and the first dielectric layer 161 and are connected with the channel layers 143(A).

It should be understood that some components are omitted in FIGS. 1A and 1B for simplicity. For example, the stacks 120 can include a staircase region where gate contact structures are configured to connect to the gate layers 105. The stacks 120 can also include dummy channel structures. Further, the semiconductor device 100 shown in FIG. 1A can be part of a memory array of 3D NAND memory circuitry that generally also includes peripheral circuitry (e.g., address decoder, driving circuits, sense amplifier and the like). The semiconductor device 100 can further include other suitable circuitry, such as logic circuitry, power circuitry, and the like that is coupled to the 3D NAND memory circuitry.

Note that while vertical memory cell strings are used here as examples, other semiconductor structures can be disposed between the first dielectric layer 161 and the substrate 101. Accordingly, the trench filler layer can include a structure other than an ACS structure, to which the contact structure 181 is configured to connect.

In some embodiments, the semiconductor device 100 may include a plurality of channel structures that correspond to the channel structures 140. The plurality of channel structures can each include a channel hole that extends through the stacks 120, a functional layer, a semiconductor layer, and a third dielectric layer disposed in the channel hole. For example, the functional layer can include a tunneling layer, a charge trapping layer, and a barrier layer, similar to the channel structures 140. The trench filler layer can be disposed over the third dielectric layer. In some embodiments, the trench filler layer includes doped polysilicon. In some embodiments, the trench filler layer and the semiconductor layer both include doped polysilicon and are connected to each other. Accordingly, a first conductive layer can be disposed over the trench filler layer. A second dielectric layer that is disposed in the trench can be arranged over the first conductive layer. Therefore, a contact structure can be configured to connect to the trench filler layer via the first conductive layer through a hole in the second dielectric layer. That is, the contact structure can be configured to connect to the semiconductor layer of the channel structure, which will be described in detail with reference to FIG. 3E. Additionally, in some examples, the first conductive layer includes tungsten, and a second conductive layer that includes titanium nitride can be disposed between the first conductive layer and the trench filler layer.

Figure 2:
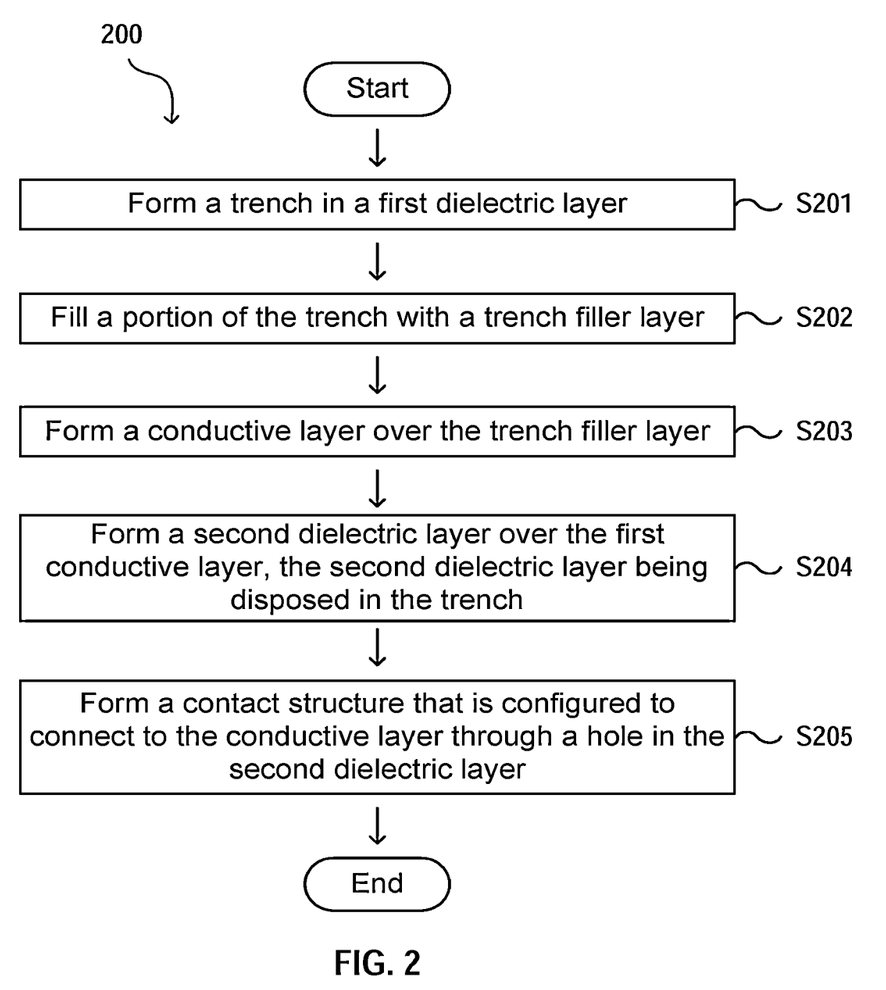
FIG. 2 shows a flow chart of an exemplary process for manufacturing a semiconductor device, in accordance with embodiments of the disclosure.

FIG. 2 shows a flow chart of an exemplary process 200 for manufacturing a semiconductor device, such as the semiconductor device 100 and the like, in accordance with exemplary embodiments of the disclosure.

At step S201, a trench is formed in a first dielectric layer. For example, one or more stacks of alternating insulating layers and sacrificial gate layers can be formed over a substrate. After forming channel structures in a core region of the one or more stacks, the first dielectric layer can be formed over the stacks. Then, the trench can be formed in the first dielectric layer and the stacks. Further, in some examples, the sacrificial gate layers can be replaced with real gate layers through the trench. In some embodiments, a third dielectric layer can be laterally disposed between the trench and the stack. In some embodiments, suitable semiconductor structures can be formed below the first dielectric layer, and the trench can be formed in the first dielectric layer and the semiconductor structures accordingly.

The process 200 then proceeds to step S202 where a portion of the trench is filled with a trench filler layer (e.g., polysilicon). Then, an etch back process can be performed on the trench filler layer to form a recess in the trench. The etch back can be performed by any suitable etch process, such as dry etch process, wet etch process and the like.

At step S203, a conductive layer is formed in the trench. In some embodiments, one or more conductive materials are deposited over the trench filler layer and the first dielectric layer.

At step S204, a second dielectric layer is deposited over the trench filler layer. The second dielectric layer is disposed in the trench. It is noted that the deposition of the one or more conductive materials and the second dielectric layer can overfill the recess in the trench. After the second dielectric layer is deposited over the one or more conductive materials, a CMP process is executed that removes an excess portion of the second dielectric layer and the one or more conductive materials on the first dielectric layer and leaves a portion of the second dielectric layer and the one or more conductive materials in the trench. Details of the CMP process will be further described with reference to FIGS. 3B, 3C, and 3C' according to some embodiments of the disclosure.

At step S205, a contact structure is formed that is configured to connect to the conductive layer through a hole in the second dielectric layer. In some embodiments, formation of the contact structure can be accomplished by etching the hole through the second dielectric layer so that the hole exposes the conductive layer. Subsequently, a conductive material is deposited to fill the hole. In some embodiments, the contact structure is a contact structure for an ACS structure that is formed in the trench. The contact structure for the ACS structure can be formed with other suitable contact structures, such as contact structures for bit lines and the like. In some embodiments, the contact structure is a contact structure for a channel structure that is formed in the trench. Details of the contact structure formation will be further described with reference to FIG. 3D according to some embodiments of the disclosure.

Figure 3A:
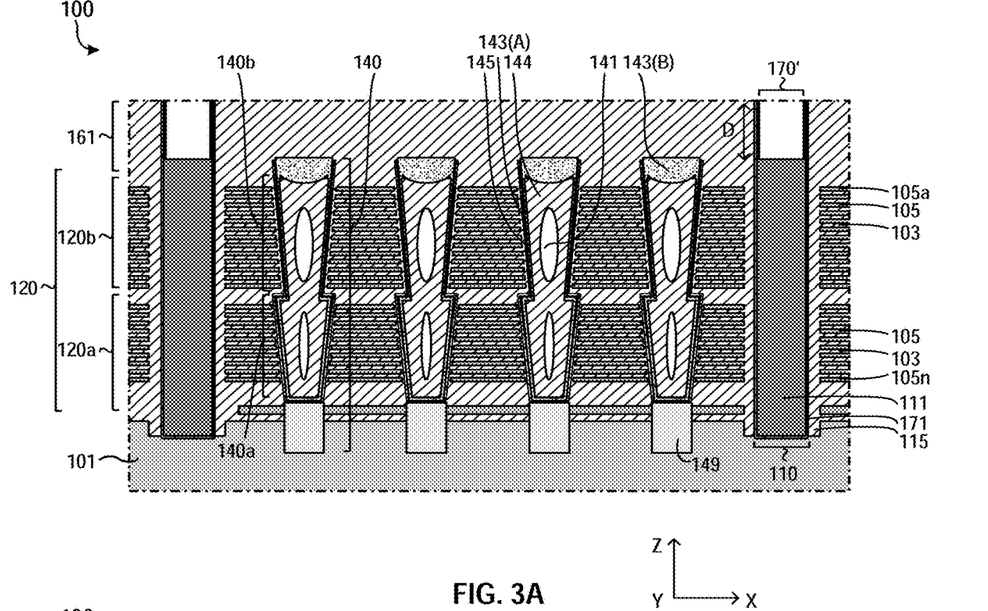
FIGS. 3A, 3B, 3C, 3D, and 3E are cross-sectional views of a semiconductor device at various intermediate steps of manufacturing, in accordance with exemplary embodiments of the disclosure.

FIGS. 3A-3E show cross-sectional views of a semiconductor device, such as the semiconductor device 100 and the like, at various intermediate steps of manufacturing, in accordance with exemplary embodiments of the disclosure. In some embodiments, FIG. 3A shows an example of the semiconductor device 100 after steps S201 and S202 are executed. That is, the trenches 110 are formed in the first dielectric layer 161 and the stacks 120, and a portion of the trenches 110 are filled with the trench filler layers 111.

Similar to the semiconductor device 100 in FIG. 1A, the semiconductor device 100 in FIG. 3A can include the first dielectric layer 161 over the stacks 120 of alternating insulating layers 103 and gate layers 105 on the substrate 101. The stacks 120 also include a plurality of channel structures 140. Some descriptions have been provided above and will be omitted here for simplicity purposes. Note that in the FIG. 3A example, a second conductive layer 171 extends beyond the trench filler layer 111 in the Z direction. In other embodiments, the second conductive layer 171 may not necessarily extend beyond the trench filler layer 111 in the Z direction.

Further, in some embodiments, recesses 170' can be formed in the trenches 110 by etching back the trench filler layers 111. For example, the trench filler layers 111 (e.g., polysilicon) can be etched back by a depth D by any suitable etch process, such as dry etch process, wet etch process and the like. In an embodiment, the depth D can range from 170 nm to 300 nm in the Z direction whereas the depth D can be about 300 nm in related examples. With less etch back of the trench filler layers 111, the recesses 170' can be positioned away from the TSG 105a in the Z direction. As a result, future conductive layers formed in the recesses 170' can be positioned away from the TSG 105a to prevent any electrical interference.

Figure 3B:
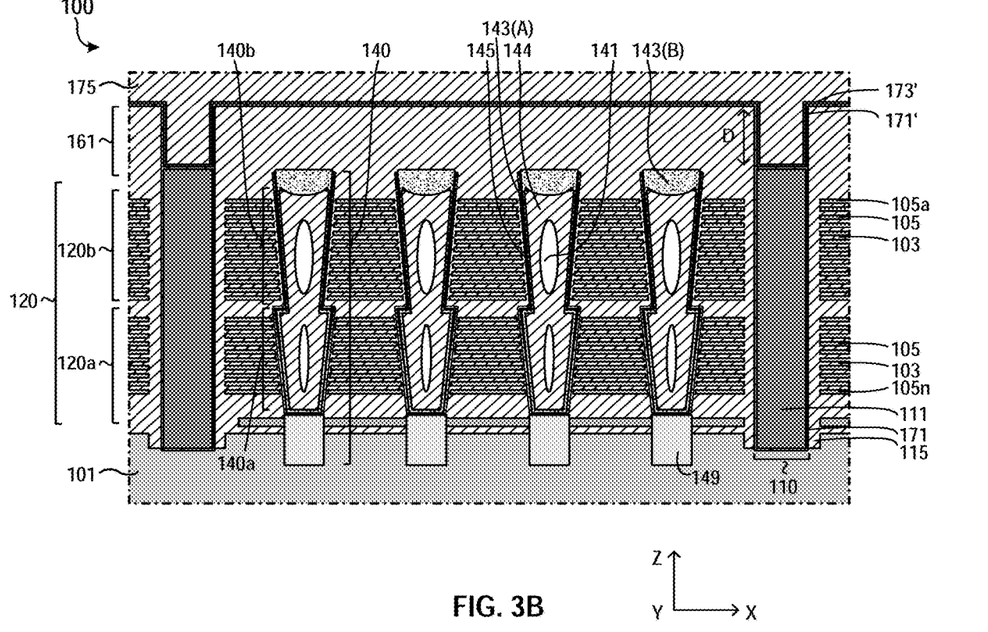

In FIG. 3B, the recesses 170' are filled with materials. Specifically, one or more conductive materials (e.g., 171' and 173') can be deposited over the trench filler layer 111 and the first dielectric layer 161. The one or more conductive materials can partially fill the recesses 170'. Then, a second dielectric layer 175 is deposited over the conductive materials 171' and 173' to fill the remaining recesses 170' and can overfill the trenches 110.

In some embodiments, the conductive materials 171' and 173' can be deposited conformally or semi-conformally. Accordingly, the conductive materials 171' and 173' can be deposited by deposition techniques that have control over film thickness and uniformity, such as atomic layer deposition and the like. In various embodiments, an overall thickness of the conductive materials 171' and 173' is relatively small compared with dimensions of the remaining recesses 170'. As a result, a majority of the recesses 170' can be filled with the second dielectric layer 175. For example, the overall thickness (e.g., about 25 nm-50 nm) of the conductive materials 171' and 173' can be smaller than a depth (e.g., about 120 nm-275 nm) in the Z direction and a width (e.g., about 200 nm) in the X direction of the remaining recesses 170'. Further, the second dielectric layer 175 and the first dielectric layer 161 can be designed to have similar or identical hardness, or designed to reduce a difference in hardness. In this example, the second dielectric layer 175 and the first dielectric layer 161 are both made of silicon oxide and thus have identical hardness. As a result, crack formation can be avoided in a subsequent CMP process. Additionally, in this example, the conductive materials 171' and 173' are made of titanium nitride (15 nm-30 nm) and tungsten (10 nm-20 nm), respectively. In another example, only one conductive material such as titanium nitride may be used.

In alternative embodiments, the one or more conductive materials (e.g., 171' and 173') can be deposited by selective deposition techniques. As a result, the conductive materials (e.g., 171' and 173') are formed only on the trench fill layer 111.

Figure 3C:
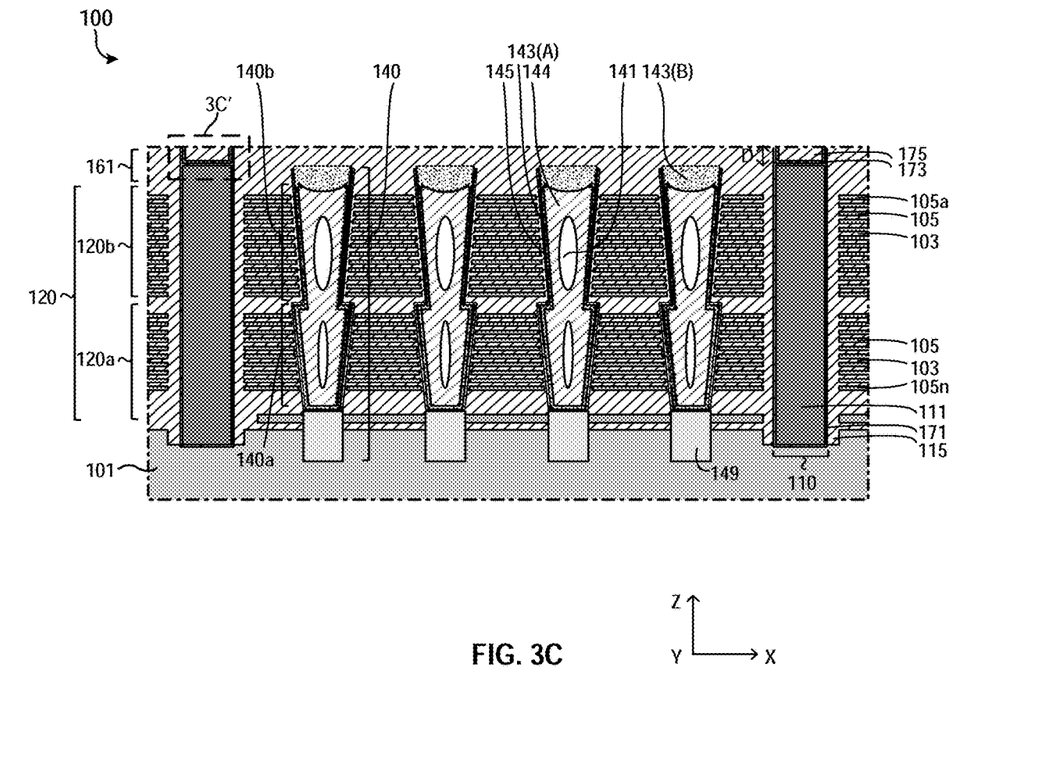

FIG. 3C shows an exemplary cross-sectional view of the semiconductor device 100 after a CMP process is executed, and FIG. 3C' shows an exemplary enlarged view of a portion (shown by 3C' in FIG. 3C) of the semiconductor device 100. As a result, a portion of the trenches 110 are removed, and a first conductive layer 173, a second conductive layer 171, and a second dielectric layer 175 are formed in the trenches 110. In some examples, the depth D is reduced to about 50 nm-120 nm, and the second dielectric layer 175 can be made of silicon oxide and have a thickness of about 25 nm-95 nm in the Z direction and a width of about 200 nm in the X direction. In one example, the first conductive layer 173 includes tungsten and has a thickness ranging from 10 nm to 20 nm, and the second conductive layer 171 includes titanium nitride and has a thickness between 15 nm to 30 nm. In another example, only one conductive layer including titanium nitride (about 15 nm-30 nm) is needed. Additionally, in some embodiments where the conductive materials 171' and 173' are selectively deposited on the trench fill layer 111, the first conductive layer 173 only has the horizontal portion 173a.

In some embodiments, the first dielectric layer 161 may have a dishing area in a staircase region (not shown) of the semiconductor device 100, due to a previous CMP process (not shown). In an embodiment, the previous CMP process is used for planarization after staircase formation. Due to the open area of the staircase region, dishing may happen in the staircase region. In an example, a depth of the dishing is related to the thickness of the stacks 120. In an example, the depth of the dishing is about 80 nm when an overall thickness of the stacks 120 is about 8.5 μm. Accordingly, the conductive materials 171' and 173' can be deposited in the dishing area and may cause short circuits if not completely or sufficiently removed. In the FIG. 3C example, the CMP process removes about 50 nm-250 nm of silicon oxide in the Z direction to make sure that the conductive materials 171' and 173' in the dishing area are removed. Note that in related examples, the aforementioned two-step CMP process is used to remove residual metal in the dishing area, and cracks can be formed at an interface of the trenches 110 and the first dielectric layer 161.

Figure 3D:
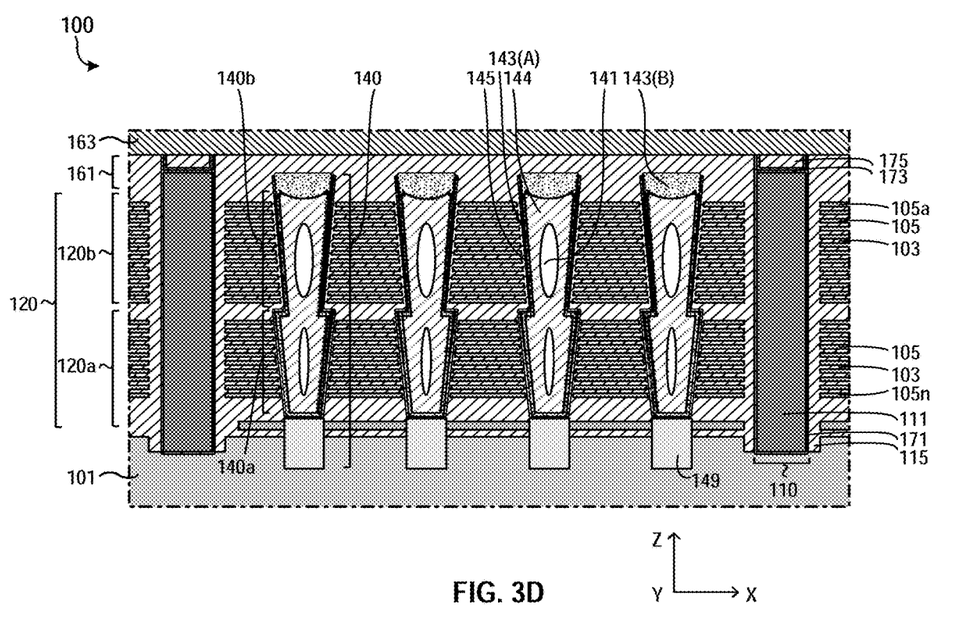

In FIG. 3D, the cap insulating layer 163 is formed over the first dielectric layer 161 and the first and second conductive layers 171 and 173. The cap insulating layer 163 can be made of any suitable dielectric material such as silicon oxide, and can be made of any suitable deposition process, such as chemical vapor deposition (CVD), and the like. Note that formation of the cap insulating layer 163 is optional.

Figure 3E:
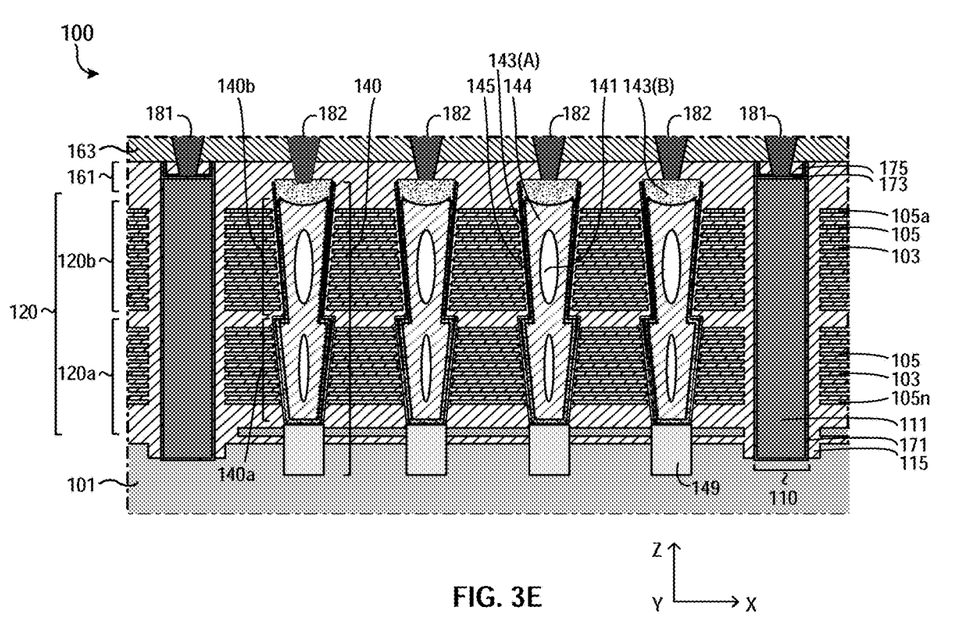

FIG. 3E shows an exemplary cross-sectional view of the semiconductor device 100 after the contact structures 181 are formed. Formation of the contact structures 181 can be accomplished by etching first holes (not shown) through the cap insulating layer 163 and the second dielectric layer 175 so that the first holes expose first conductive layers 173. Subsequently, a conductive material can be deposited to fill the first holes. In the FIG. 3E example, the channel contact structures 182 (also referred to as bit line contact structures) that are configured to connect to the channel structures 140 can also be formed. Similarly, second holes (not shown) can be formed by etching through the cap insulating layer 163 and the second dielectric layer 175 to expose the channel structures 140, followed by a conductive material deposition to fill the second holes. For example, the contact structures 181 and the channel contact structures 182 can be made of tungsten and deposited by chemical vapor deposition.

It should be noted that additional steps can be provided before, during, and after the process, and some of the steps described can be replaced, eliminated, or performed in a different order for additional embodiments of the process. For example, after the stacks 120 are formed, a staircase region can be formed in the stacks 120 in some embodiments, and gate contact structures that are configured to connect to the gate layers can be formed in the staircase region.

In some embodiments, contact structures 182 to the drain terminals, shown by 143(B), of the channel structures can be formed in a similar manner as the contact structures 181 described above. For example, on the semiconductor device 100, a plurality of channel structures can each be formed in a respective channel hole and extend vertically through the stack into the substrate. The plurality of channel structures can each include various layers disposed from sidewalls of the respective channel holes, such as a blocking insulating layer, a charge storage layer, a tunneling insulating layer, a semiconductor layer, and an insulating layer. The semiconductor layer can be configured into a current channel of a channel structure during operation, and is also referred to as a channel layer shown by 143(A). In some examples, a drain layer (to form the drain terminal 143(B)) is disposed into an upper portion of the channel hole. In some embodiments, the drain layer can be the same material (e.g., doped polysilicon) as the trench filler layer and can be deposited by the same process that deposits the trench filler layer. The drain layer is formed in connection with the channel layer 143(A) of the channel structure. In an example, the drain layer can be etched back to form the drain terminal 143(B) and a recess in the channel hole by a similar etch back process for the trench filler layer shown in FIG. 3A.

Subsequently, similar to the process shown in FIG. 3B, a first conductive layer can be formed over the drain layer in the recess in the channel hole, and a second dielectric layer can be formed over the first conductive layer in the recess. The second dielectric layer is disposed in the channel hole and may overfill the recess. In some embodiments, the first conductive layer may not be necessary. Then, a CMP process is performed on the semiconductor structure, similar to the process shown in FIG. 3C. Next, a contact structure 182 can be formed that extends through a hole in the second dielectric layer, similar to what is shown in FIGS. 3D and 3E. In one embodiment, the contact structure is physically connected to the first conductive layer so that the contact structure is configured to connect to the drain terminal 143(B) via the first conductive layer. In another embodiment, the first conductive layer is unnecessary. As a result, the contact structure is directly connected to the drain terminal 143(B).

The various embodiments described herein offer several advantages. For example, in the related example, a depth of the etch back (e.g., poly etch back) can typically be around 300 nm and two CMP steps are required, whereas the depth of the etch back can be reduced to around 170 nm-300 nm and a single step CMP process can be used in an example according to the present disclosure. Techniques herein can therefore reduce the CMP complexity and time. Further, by selecting the second dielectric layer with hardness/softness similar or identical to that of the first dielectric layer, CMP crack defects can be reduced or avoided.

"Device" or "semiconductor device" as used herein generically refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a trench formed in a first dielectric layer;
a trench filler layer that fills a portion of the trench;
a first conductive layer over the trench filler layer;
a second dielectric layer over the first conductive layer, the second dielectric layer being disposed in the trench; and
a contact structure configured to connect to the first conductive layer through a hole in the second dielectric layer,
wherein the first conductive layer comprises a first portion between the second dielectric layer and the trench filler layer and a second portion disposed along a sidewall of the trench, the second portion being between the sidewall of the trench and the second dielectric layer.

2. The semiconductor device of claim 1, wherein the first conductive layer comprises at least one of a tungsten layer or a titanium nitride layer.

3. The semiconductor device of claim 1, wherein the first dielectric layer and the second dielectric layer include a same material.

4. The semiconductor device of claim 1, further comprising:
a substrate;
a stack of alternating insulating layers and gate layers between the first dielectric layer and the substrate; and
a plurality of channel structures each extending vertically through the stack into the substrate and each being spaced apart from the trench filler layer and the first conductive layer.

5. The semiconductor device of claim 1, further comprising:
a substrate;
a stack of alternating insulating layers and gate layers between the first dielectric layer and the substrate; and
a plurality of channel structures each extending vertically through the stack into the substrate.

6. The semiconductor device of claim 5, wherein:
the plurality of channel structures each comprises a channel hole that extends through the stack, a functional layer, a semiconductor layer, and a third dielectric layer being disposed in the channel hole, and
the trench filler layer is disposed over the third dielectric layer.

7. The semiconductor device of claim 5, wherein the trench filler layer comprises doped polysilicon.

8. The semiconductor device of claim 1, further comprising:
a substrate; and
a stack of alternating insulating layers and gate layers between the first dielectric layer and the substrate, wherein:
the trench extends through the stack and divides the stack into blocks.

9. The semiconductor device of claim 8, further comprising a second conductive layer along a sidewall of the trench, the second conductive layer being disposed between the stack and the trench.

10. The semiconductor device of claim 9, further comprising:
a third dielectric layer laterally between the trench and the stack, the third dielectric layer and the first dielectric layer including a same material.

11. The semiconductor device of claim 9, wherein the second conductive layer comprises titanium nitride.

12. A semiconductor device, comprising:
a stack of alternating insulating layers and gate layers;
a first dielectric layer over the stack;
a trench extending vertically through the first dielectric layer and the stack;
a trench filler layer that fills a portion of the trench;
a first conductive layer including a first portion disposed over the trench filler layer and a second portion disposed along a sidewall of the trench; and
a second dielectric layer disposed in the trench, the second dielectric layer being coplanar with the second portion of the first conductive layer,
wherein the first portion is disposed between the second dielectric layer and the trench filler layer, and the second portion is disposed between the sidewall of the trench and the second dielectric layer.

13. The semiconductor device of claim 12, wherein:
the first conductive layer comprises at least one of tungsten or titanium nitride, and
the second dielectric layer comprises silicon oxide.

14. The semiconductor device of claim 12, further comprising:
a third dielectric layer laterally between the trench and the stack, the third dielectric layer and the first dielectric layer including a same material.

15. The semiconductor device of claim 12, further comprising:
a second conductive layer that includes a first portion between the stack and the trench and a second portion between the trench filler layer and the substrate.

16. The semiconductor device of claim 12, wherein the first conductive layer is positioned above the gate layers.

17. The semiconductor device of claim 12, further comprising a contact structure that is configured to connect to the first conductive layer through a hole in the second dielectric layer.

18. The semiconductor device of claim 17, further comprising a cap insulating layer disposed over the first dielectric layer, wherein the contact structure is connected to the first conductive layer through a hole extending in the cap insulating layer and the second dielectric layer.

19. A method of fabricating a semiconductor device, the method comprising:
forming a trench in a first dielectric layer;
filling a portion of the trench with a trench filler layer;
forming a conductive layer over the trench filler layer;
forming a second dielectric layer over the conductive layer, the second dielectric layer being disposed in the trench; and
forming a contact structure that is configured to connect to the conductive layer through a hole in the second dielectric layer,
wherein the conductive layer comprises a first portion between the second dielectric layer and the trench filler layer and a second portion disposed along a sidewall of the trench, the second portion being between the sidewall of the trench and the second dielectric layer.

20. The method of claim 19, wherein the forming the conductive layer over the trench filler layer and the second dielectric layer over the trench filler layer comprises:
depositing one or more conductive materials over the trench filler layer and the first dielectric layer;
depositing the second dielectric layer in the trench and over the one or more conductive materials; and
executing a chemical mechanical polishing (CMP) process that removes the second dielectric layer and the one or more conductive materials on the first dielectric layer.

21. The method of claim 19, further comprising:
depositing a cap insulating layer over the first dielectric layer, the conductive layer, and the second dielectric layer, wherein the hole further extends through the cap insulating layer; and
forming the contact structure that is configured to connect to the conductive layer through the hole.

22. The method of claim 19, wherein the forming the trench in the first dielectric layer further comprises:
forming a stack of alternating insulating layers and sacrificial gate layers over a substrate;
forming channel structures in a core region of the stack;
depositing the first dielectric layer over the stack; and forming the trench in the first dielectric layer and the stack.

23. The method of claim 22, wherein:
the forming the conductive layer over the trench filler layer comprises filling the trench with the trench filler layer, etching back the trench filler layer to form a recess, and forming the conductive layer in the recess.

\* \* \* \* \*